(12) United States Patent
Maeda et al.

(10) Patent No.: US 8,664,085 B2
(45) Date of Patent: Mar. 4, 2014

(54) METHOD OF MANUFACTURING COMPOSITE SUBSTRATE

(71) Applicant: Sumitomo Electric Industries, Ltd., Osaka (JP)

(72) Inventors: Yoko Maeda, Itami (JP); Fumitaka Sato, Itami (JP); Akihiro Hachigo, Itami (JP); Seiji Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/653,421

(22) Filed: Oct. 17, 2012

(65) Prior Publication Data

US 2013/0040437 A1 Feb. 14, 2013

Related U.S. Application Data

(63) Continuation of application No. PCT/JP2011/059582, filed on Apr. 19, 2011.

(30) Foreign Application Priority Data

Apr. 20, 2010 (JP) ................................. 2010-096818

(51) Int. Cl.
*H01L 21/30* (2006.01)
*H01L 21/46* (2006.01)

(52) U.S. Cl.
USPC ........... 438/458; 438/455; 438/456; 438/457; 257/E21.568

(58) Field of Classification Search
USPC .............. 438/22, 60, 455, 458, 660; 257/183, 257/E21.088, E21.132, E21.407, E21.568
See application file for complete search history.

(56) References Cited

U.S. PATENT DOCUMENTS

2008/0169483 A1* 7/2008 Kasai et al. .................... 257/183
2010/0183896 A1* 7/2010 Liu et al. ........................ 428/647

FOREIGN PATENT DOCUMENTS

| JP | H11-097379 A | 4/1999 |
|---|---|---|
| JP | 2003-264130 A | 9/2003 |
| JP | 2006-210660 A | 8/2006 |
| JP | 2007-073768 A | 3/2007 |
| JP | 2007-220899 A | 8/2007 |
| JP | 2008-010766 A | 1/2008 |
| JP | 2010-045098 A | 2/2010 |
| WO | WO-2009-030662 A2 | 3/2009 |

* cited by examiner

*Primary Examiner* — Charles Garber
*Assistant Examiner* — Abdulfattah Mustapha
(74) *Attorney, Agent, or Firm* — James W. Judge

(57) ABSTRACT

A composite-substrate manufacturing method is provided with: a step of carrying out implantation of ions through a surface of a bulk substrate composed of the nitride compound semiconductor; a step of setting said surface of the bulk substrate against the second substrate, and bonding the bulk substrate and the second substrate together to obtain a bonded substrate; a step of elevating the temperature of the bonded substrate to a first temperature; a step of sustaining the first temperature for a fixed time; and a step of producing a composite substrate by severing the remaining portion of the bulk substrate from the bonded substrate; characterized in that a predetermined formula as for the first temperature, the thermal expansion coefficient of the first substrate, and the thermal expansion coefficient of the second substrate is satisfied.

6 Claims, 2 Drawing Sheets

METHOD OF MANUFACTURING COMPOSITE SUBSTRATE

CROSS-REFERENCE TO RELATED APPLICATIONS

This is a continuation of International Application No. PCT/JP2011/059582, filed on Apr. 19, 2011 which claims the benefit of Japanese application No. 2010-096818, filed on Apr. 20, 2010, each of which is hereby incorporated by reference in their entirety.

BACKGROUND OF THE INVENTION

1. Technical Field

The present invention relates to methods of manufacturing composite substrates for epitaxial-layer growth, formed by bonding together a first substrate composed of a nitride compound semiconductor, and a second substrate composed of a material that is either identical with or different from the material constituting the first substrate.

2. Background Art

Semiconductor microelectronic devices, such as light-emitting devices, (also denoted simply "devices" hereinafter) employing nitride compound semiconductors are created by a variety of methods. In general, they are fabricated by forming a nitride compound semiconductor layer, by molecular-beam epitaxy (MBE), metal organic vapor phase epitaxy (MOCVD) or a like technique, onto a substrate composed of a material (such as silicon, silicon carbide or sapphire, for example) that is of a different type from, yet whose thermal expansion coefficient is close to, the nitride compound semiconductor, or by forming nitride-compound semiconductor layers onto a nitride compound semiconductor bulk substrate. Either way, fabricating the devices by growing epitaxial layers onto substrates is the general practice.

When a substrate of a material that differs from the nitride compound semiconductor is used to fabricate devices, disparity in thermal expansion coefficient and lattice mismatch will arise. This leads to the problems of stress developing in the substrate, which gives rise to deterioration in the device properties due to warpage in the substrate and devices, and of exfoliation of the semiconductor layers and increase in dislocation density arising, which exerts a negative influence on the device properties.

Meanwhile, when nitride compound semiconductor bulk substrates are employed, because the thermal expansion coefficient and the lattice-matching between the bulk substrate and the semiconductor layers are on par, favorable device properties are exhibited. Nevertheless, a problem with nitride compound semiconductor bulk substrates is that they extraordinarily expensive, such that the cost is reflected in the price of the devices.

Therein, for the reason that despite favorable device properties being obtained when nitride compound semiconductor bulk substrates are employed the cost proves expensive, the development of low-cost substrates for nitride compound semiconductor layer formation (that is, for epitaxial layer growth) is being variously investigated.

For example, reducing the thickness of a bulk substrate constituted from a nitride compound semiconductor may lower the cost of the substrate, yet disadvantageously leaves it prone to fracturing. Consequently, attention is being given to composite substrates obtained by joining thinly to the nitride compound semiconductor a second substrate made of a different substance from the nitride compound semiconductor.

Technology for fabricating a composite substrate is disclosed for example in Patent Literature 1.

With the composite substrate fabrication method of Japanese Unexamined Pat. App. Pub. No. 2006-210660, a fragile region is formed in advance within the nitride compound semiconductor for ease of exfoliation, and the nitride compound semiconductor in which the fragile region has been formed is bonded together with a second substrate. Then, after the nitride compound semiconductor and the second substrate are unified, with the fragile region as a boundary, the nitride compound semiconductor is severed from the second substrate. Forming a thin nitride compound semiconductor in this way atop the second substrate fabricates a composite substrate. In the following, the technology for composite substrates fabricated in this way will be denoted "bonding technology" in particular.

Technical Problem

A problem, however, with fabricating composite substrates by means of bonding technology has been than when the nitride compound semiconductor is severed from the second substrate, the nitride compound semiconductor does not part away with the fragile region as the boundary. That is, a frequently occurring problem has been that rather than thin nitride compound semiconductor remaining on the second substrate, the bonded-on nitride compound semiconductor exfoliates intact from the second substrate.

Or even if it exfoliates with the fragile region as the boundary, in device fabrication employing the fabricated composite substrate (for example, during manufacturing steps such as annealing and dicing processes) exfoliation along the bonding plane in the composite substrate has sometimes occurred.

A problem of this sort may be presumed to originate in the joining strength between the nitride compound semiconductor and the second substrate being weak. Accordingly, attempts have been made to heighten the joining strength, in which, of the front/back sides of the nitride compound semiconductor, the surface on the side onto which the second substrate is bonded is made smooth, and the second substrate is bonded onto that surface. Nevertheless, the joining strength by means of this technique cannot be said to be sufficient, such that further improvement in the joining strength is being sought.

BRIEF SUMMARY OF THE INVENTION

The present invention has taken into consideration current circumstances as discussed above, and an object thereof is to make available a method of manufacturing a composite substrate in which the joining strength between a first substrate composed of a nitride compound semiconductor and a second substrate is high.

Solution to Problem

A method, of the present invention, of manufacturing a composite substrate is method of manufacturing a composite substrate for epitaxial-layer growth, formed by bonding together a first substrate composed of a nitride compound semiconductor, and a second substrate composed of a material that is either identical with or different from the material constituting the first substrate, and includes: a step of carrying out implantation of ions through a surface of a bulk substrate composed of the nitride compound semiconductor; a step of setting said surface of the bulk substrate against the second substrate and bonding the bulk substrate and the second substrate together to obtain a bonded substrate; a step of elevating the temperature of the bonded substrate to a first temperature; a step of sustaining the first temperature for a fixed time; and a step of producing a composite substrate by severing, in such as way as to leave the first substrate as a portion of the bulk substrate atop the second substrate, the remaining portion of the bulk substrate from the bonded substrate; characterized in that letting the first temperature be $T_1°$ C., the thermal expansion coefficient of the first substrate be $A \times 10^6/°$ C., and the thermal expansion coefficient of the second substrate be $B \times 10^{-6}/°$ C., the following formula (I) is satisfied.

$$215 \leq 10(A-B)^2 - 10(A-B) + T_1 > 410 \quad (I)$$

In addition, a separate method, involving the present invention, of manufacturing a composite substrate is a method of manufacturing a composite substrate for epitaxial-layer growth, formed by bonding together a first substrate composed of a nitride compound semiconductor, and a second substrate composed of a material that is either identical with or different from the material constituting the first substrate, and includes: a step of carrying out implantation of ions on a surface of a bulk substrate composed of the nitride compound semiconductor, at an angle θ being 0°<θ>7° with respect to a normal to said surface; a step of setting said surface of the bulk substrate against the second substrate and bonding the bulk substrate and the second substrate together to obtain a bonded substrate; and a step of producing a composite substrate by severing, in such as way as to leave the first substrate as a portion of the bulk substrate atop the second substrate, the remaining portion of the bulk substrate from the bonded substrate.

In the step of producing the composite substrate, it is preferable to sever the remaining portion of the bulk substrate from the bonded substrate by elevating the bonded substrate to a second temperature and sustaining the second temperature for a fixed time.

It is preferable that, following the step of producing a composite substrate, a step of elevating the composite substrate to a third temperature and a step of sustaining the third temperature for a fixed time be further included.

The third temperature preferably is between 600° C. and 1000° C. inclusive.

A step, either before or after the step of carrying out ion implantation through a surface of the bulk substrate, of forming a metal film onto said surface of the bulk substrate is preferably included, with the metal film being composed of one between either tungsten or molybdenum, or of both.

It is preferable that, either before or after the step of carrying out ion implantation, a step of forming a first coating on said surface of the bulk substrate, and a step of forming a second coating on the second substrate be included, and that in the step of setting and bonding to obtain a bonded substrate, the first coating and the second coating be set in opposition and bonded together.

Advantageous Effects of Invention

A composite-substrate manufacturing method of the present invention has the outstanding benefit of making it possible to heightening the joining strength between the first substrate and the second substrate.

DETAILED DESCRIPTION OF THE INVENTION

Modes for Embodying Invention

Figure 1:
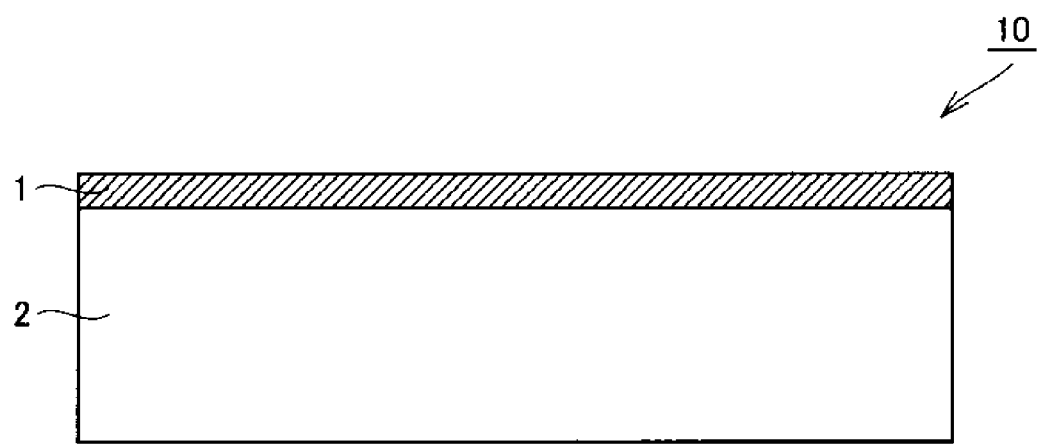
FIG. 1 is a cross-sectional, schematic diagram representing an example of a composite substrate manufactured according to the present invention.

Below, an explanation of the present invention will be made in detail. It should be understood that in the following description of embodiment modes, the explanation is made using the drawings, and what in the drawings of the present application is labeled with identical reference marks indicates identical parts or else corresponding parts.

Composite Substrate

FIG. 1 is a cross-sectional, schematic diagram representing an example of a composite substrate manufactured according to the present invention. The composite substrate 10 manufactured according to the present invention is, as indicated in FIG. 1, formed by bonding together a first substrate 1 composed of a nitride compound semiconductor, and a second substrate 2 composed of a material that is either identical with or different from the material constituting the first substrate.

Onto the first substrate 1 in the composite substrate 10, epitaxial layers constituting, although not particularly limited, semiconductor devices of conventional, publicly known makeup of all sorts can be grown. As a method of forming such epitaxial layers, from the perspectives of allowing stable growth of active layers, and of being able to obtain favorable film quality with high growth rates, MOCVD preferably is utilized. The structural components of the composite substrate 10 will be explained below.

First Substrate

For the nitride compound semiconductor constituting the first substrate 1 employed in the present invention, while not particularly limited, a conventional, publicly known nitride compound semiconductor can be utilized, with a material having the crystalline structure of hexagonal crystal being preferable. When a nitride compound semiconductor having the crystalline structure of hexagonal crystal is employed, a hexagonal-crystal crystalline structure forms stably in the epitaxial layers formed onto the material. On that account, epitaxial layers lent a hexagonal-crystal crystalline structure, created by MOCVD with device-formation as the objective, are rendered of favorable material quality.

Examples that can be given of the nitride compound semiconductor utilized in the present invention include GaN, AlGaN, InGaN, AlN and InN, and these may utilized each individually or else in combinations of two or more types. Among such materials, from the perspectives of the crystallinity being favorable and of bulk substrates being manufactured and sold, and thus easily procured, constituting 90 mass % or more of the material from gallium nitride is preferable.

Here, it is preferable to have the thickness of the first substrate 1 be 50 nm to 50 μm; having it be 100 nm to 2 μm is more preferable. The reason is because at less than 50 nm, surface processing of the first substrate in order to grow epitaxial layers proves challenging, and because surpassing 50 μm is prohibitive of forming the fragile region by ion irradiation or plasma irradiation and exfoliating it.

Second Substrate

The second substrate 2 is bonded together with the first substrate 1 composed of a nitride compound semiconductor. The second substrate 2, not being particularly limited, may be constituted from a material (substance) identical with the material constituting the first substrate 1, or may be constituted from a substance apart from the material constituting the first substrate. The material constituting the second substrate 2 preferably is imparted with heat-resistance, so as be able to withstand the high-temperature environment when it is bonded together with the first substrate 1, as well as when epitaxial layers are grown onto the first substrate. More preferably, a material having the heat resistance to be able to withstand temperatures of 1000° C. or more is selected as the material of the second substrate 2.

The second substrate may be of composition that differs from that of the nitride compound semiconductor constituting the first substrate, or may be of composition that is identical with, and of crystalline state that is different from, that of the nitride compound semiconductor constituting the first substrate.

Also, given that the second substrate 2 is exposed to gaseous atmospheres such as ammonia, etc., when epitaxial layers are grown onto the first substrate 1, preferably it has corrosion resistance to be able to withstand such gaseous atmospheres.

Still further, a material having a thermal expansion coefficient near the thermal expansion coefficient of the first substrate 1 is preferably utilized for the second substrate 2. This makes it possible to prevent the first substrate 1 from fracturing when, after the second substrate 2 has been bonded together with the first substrate 1, epitaxial layers are grown onto it at 900° C. or more. Also, it is preferable that the second substrate 2 be inexpensive relative to the first substrate 1.

When the second substrate composed of a nitride compound semiconductor is utilized, preferably an $SiO_2$ film is formed in between the first substrate and the second substrate. This enables exfoliating along the interface between the first substrate and the second substrate after epitaxial layers have been formed onto the composite substrate in which the first substrate and the second substrate have been bonded together, by etching the $SiO_2$ film in a solution of hydrofluoric acid or the like, or by irradiating the $SiO_2$ film through the underside of the second substrate with a laser or the like. The second substrate exfoliated in this way may be reused during fabrication of the next composite substrate.

Taking the several foregoing issues into consideration, examples that can be given of the second substrate 2 include single-crystal such as sapphire and silicon, single-crystal or polycrystal such as GaN, SiC, $ZrB_2$, AlN $Al_2O_3$ and spinel, and metal substrates. In instances in which GaN is utilized as the second substrate 2, it is especially preferable that the GaN be polycrystal, yet it may be inferior in crystallinity to that of the first substrate. It should be noted that as long as the second substrate 2 here has a hardness and thickness of the level that allows it to sustain the first substrate 1, its geometry and physical nature are not limited; nevertheless, as to its thickness, preferably it has a thickness of some 50 µm or more (that is, a thickness greater than the thickness of the first substrate 1).

For example, in an instance in which a GaN substrate, the thermal expansion coefficient of which is $5.4 \times 10^{-6}/°$ C., is utilized as the first substrate 1, utilizing as the second substrate 2 a spinel substrate, the thermal expansion coefficient of which is $7.5 \times 10^{-6}/°$ C., a sapphire substrate, the thermal expansion coefficient of which is $7 \times 10^{-6}/°$ C., a silicon substrate, the thermal expansion coefficient of which is $2.6 \times 10^{-6}/°$ C., or AlN or like material the thermal expansion coefficient of which is $4.2 \times 10^{-6}/°$ C. is preferable. It should be understood that for the thermal expansion coefficients in the present invention it is assumed that values measured by a thermomechanical analyzer (TMA: thermomechanical analysis) are adopted.

Composite-Substrate Manufacturing Method

Below, referring to FIG. 2 through FIG. 4, an explanation of a composite-substrate manufacturing method of the present invention will be made.

Figure 2:
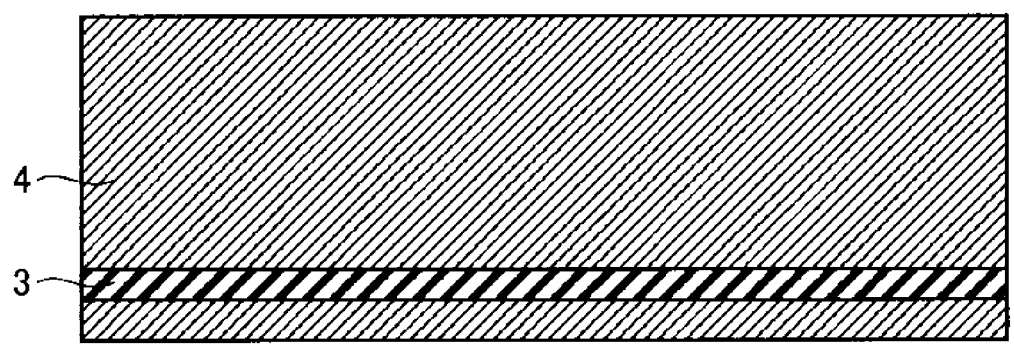
FIG. 2 is a cross-sectional, schematic diagram representing the state of a bulk substrate after a fragile region has been formed therein.

FIG. 2 is a cross-sectional, schematic diagram representing the state of a bulk substrate after a fragile region has been formed therein; FIG. 3 is a cross-sectional, schematic diagram representing a bonded substrate after a second substrate has been bonded onto the bulk substrate; and FIG. 4 is a diagram representing a composite substrate manufactured by severing the bonded substrate with the fragile region as a boundary.

Embodying Mode 1

In order to overcome the problem of the joining strength along the plane where a substrate composed of a nitride compound semiconductor and a second substrate are bonded together being weak, the present inventors reinvestigated the procedure for manufacturing composite substrates. In particular, upon reviewing the procedural step, in the process of manufacturing a composite substrate, of severing the bonded-together substrate with the fragile region as a boundary, they gained the insight that prior to severing the bonded-together substrate, elevating the substrate temperature to a certain fixed temperature could heighten the joining strength along the bonding plane.

Based on such an insight, upon iterating further studies with regard to the temperature conditions in order to heighten the joining strength, it became evident that extremely precise temperature adjustment is necessary. Namely, it was understood that if the temperature is too low when the temperature has been raised, the joining strength cannot be sufficiently heightened, and conversely, if it is too high, prior to the joining strength being heightened, severance at the fragile region gets underway.

With that understanding, the present inventors, upon investigating temperature conditions in order to heighten the joining strength at the bonding plane without severance at the fragile region progressing, discovered that such temperature conditions are intimately related to the difference in thermal expansion coefficient of the two substrates that are bonded together, and ultimately came to complete the present Embodying Mode 1.

Namely, with the present Embodying Mode 1, by establishing the joining-strength heightening temperature conditions so as, when the temperature of the bonded substrate has been elevated, to lower the temperature to the extent the disparity between the thermal expansion coefficient of the first substrate composed of a nitride compound semiconductor and the thermal expansion coefficient of the second substrate is large, they succeeded in heightening the joining strength between the first substrate and the second substrate.

A composite-substrate manufacturing method of the present Embodying Mode 1 is characterized in including: a step (FIG. 2) of carrying out implantation of ions through a surface of a bulk substrate 4 composed of a nitride compound semiconductor; a step (FIG. 3) of setting said surface of the bulk substrate 4 against the second substrate 2, and bonding the bulk substrate 4 and the second substrate 2 together to obtain a bonded substrate 20 (i.e., a step to obtain a bonded substrate 20 by making it so that said surface of the bulk substrate 4 opposes a second substrate 2 and bonding the bulk substrate 4 and the second substrate 2 together); a step of elevating the temperature of the bonded substrate to a first temperature; a step of sustaining the first temperature for a fixed time; and a step (FIG. 4) of producing a composite substrate by severing, in such as way as to leave a portion of the bulk substrate 4, atop the second substrate 2, the remaining portion of the bulk substrate 4 from the bonded substrate 20. The details of each step will be explained in the following.

Ion Implantation Step

A nitride-compound-semiconductor bulk substrate 4 that will constitute the first substrate is prepared. It is necessary for this bulk substrate 4 to have a thickness such that it will not break in bonding and handling.

By carrying out ion irradiation or plasma irradiation on the surface of the bulk substrate 4 on one of its sides, ions can be implanted to a predetermined depth from that surface. The region where the ions have been implanted then becomes a fragile region 3. In later procedural steps, the bulk substrate is severed along the fragile region 3 (FIG. 4). It should be noted that the series of above-described operations in which a thin slice of substrate is severed from the bulk substrate 4 by carrying out ion irradiation or a like process is at times referred to as an "ion-cut" process.

The fragile region 3 preferably is formed by ion irradiation. The fragile region 3 is a region that is severed (exfoliated) by the application of heat or the application of force. While ions of any atomic element may be used for the implantation ions, hydrogen, helium, nitrogen, argon or the like are preferable, with light atomic elements such as hydrogen or helium being especially preferable. Utilizing light atoms of this sort allows the implantation of ions to a relatively deep location in the bulk substrate 4, and makes it possible to minimize crystal deterioration in the bulk substrate 4 due to the passing through of ions.

The dose of ions contained in the fragile region 3 is not particularly limited as long as it is of a level allowing severance of the bulk substrate 4 in the later procedural step, but from the perspective of ease of severing the bulk substrate 4, it is preferable that the dose be between $1 \times 10^{17}$ cm$^{-2}$ and $1 \times 10^{18}$ cm$^{-2}$ inclusive. If less than $1 \times 10^{17}$ cm$^{-2}$, severing the bulk substrate 4 in the latter process stage tends to become problematic. On the other hand, if in excess of $1 \times 10^{18}$ cm$^{-2}$, the crystallinity of the first substrate left atop the second substrate after the bulk substrate 4 has been severed can turn out poor or, on account of the implanted ions appearing on the surface at ordinary temperatures such that the surface becomes rough, joining can prove impossible.

The acceleration voltage of the ions when ion implantation is carried out preferably is between 50 keV and 150 keV inclusive. Ions are not implanted to a sufficient depth in the bulk substrate 4 if the acceleration voltage is less than 50 keV, leading to hindrances during severing of the bulk substrate 4. The extent over which ions are implanted depth-wise in the bulk substrate 4 broadens if the voltage is in excess of 150 keV, such that the thickness of the fragile region 3 grows fat.

It is preferable that the temperature when the ion implantation is carried out be between room temperature and less than 150° C.

Therein, prior to the implanting of ions into the bulk substrate 4, the face on which ion implantation is carried out preferably is polished. In this way polishing the bulk substrate 4 makes it possible to bond it together favorably with the second substrate 2.

Further, as to the surfaces of the bulk substrate 4, the face on one of its sides is a wafer face, and the face on the other of its sides is an N-face, wherein the ion implantation preferably is carried out on the N-face of the bulk substrate 4. It is thereby possible to have the face of the first substrate on the side reverse from the side that is bonded together with the second substrate be the wafer face, i.e., the (0001) face. This is accordingly effective to facilitate crystal growth of epitaxial layers onto the first substrate. It is to be noted that the ion implantation may be carried out along the direction of a normal to the surface of the bulk substrate 4, or the ion implantation may be carried out along the direction of a fixed angle θ with respect to a normal to the surface of the bulk substrate 4 in the embodiment mode. The angle θ is, for example, $0° < θ ≤ 7°$.

Bonding Step

Next, a bonded substrate 20 (FIG. 3) is produced by bonding the bulk substrate 4 (first substrate) in which the fragile region 3 has been formed as described above, to the second substrate 2. Herein, prior to bonding the bulk substrate 4 and the second substrate 2 together, it is preferable that the bonding faces be processed so as to be specular faces. After in this way rendering the surfaces of the two substrates specular faces, setting the specular-face portions against each other and heating the substrates under an applied load enables the bulk substrate 4 and the second substrate 2 to be bonded together favorably.

Methods apart from the method just described include, for example, a technique of bonding the bulk substrate 4 and the second substrate 2 together by exposing them under a plasma, and a technique of actuating a plasma, ions, neutral particles, etc. under a vacuum to promote the reaction of the surfaces of the bulk substrate 4 and the second substrate 2 and bond them together.

Otherwise, as long as the method is such that the properties of the substrate itself apart from the vicinity of the bonding interface may be sustained, the bonding technique is not particularly limited, and joining that employs an adhesive composed of an organic compound or an inorganic compound may be cited as an example. Alternatively, solid-phase joining such as anodic bonding, thermocompression bonding, and diffusion bonding, solid-liquid reaction joining such as solder joining and eutectic bonding, and liquid-phase joining such as spot fusion bonding may be employed.

Among these joining techniques, it is preferable to utilize eutectic bonding. In instances in which eutectic bonding utilized to bond the substrates together, a metal film is formed onto the surface of the bulk substrate 4, and bonding is carried out by stacking the bulk substrate 4 and the second substrate 2 together and applying heat to the stack. The metal film in this case preferably is composed of one of either tungsten or molybdenum, or of both. The joining strength can thereby be heightened. It should be noted that the metal film may be formed prior to the step of implanting ions, or may be formed afterwards.

The thickness of the metal film preferably is between 50 nm and 1000 nm inclusive. Being less than 50 nm fails to yield sufficient joining strength, while exceeding 1000 nm is undesirable because the metal film will fuse during high temperatures and it will wrap around the lateral face of the composite substrate.

As a joining technique apart from eutectic bonding, a method may be utilized in which a first coating is formed on a surface of the bulk substrate, a second coating is formed on the second substrate, the first coating and the second coating are set against each other, and the substrates are bonded together. The coatings preferably are formed from a material through which ions can readily travel. Ions can thereby travel easily along the interface to enable the bulk substrate 4 and the second substrate 2 to be bonded together.

It should be noted that the process of forming the first coating on a surface of the bulk substrate may be anytime as long as it is ahead of the step to obtain a bonded substrate, and may be carried out before or after the step of implanting ions. Likewise, the process of forming the second coating onto the second substrate may be anytime ahead of the step to obtain a bonded substrate.

Oxides such as $SiO_2$, and nitrides such as $Si_3N_4$ can be cited as suitable materials for a first and second coatings of this sort. An advantage to the Si and O constituting the materials for this sort of first and second coatings is that should they become incorporated into the first substrate as impurities, they will function as donors.

Techniques that can be given for forming the first and second coatings include vapor deposition, sputtering, and chemical vapor-phase growth (CVD: chemical vapor deposition). Meanwhile, in instances in which the second substrate is composed of silicon, in addition to the techniques just cited, the second coating may be formed onto the surface of the second substrate by heat-oxidizing the surface. The thickness of the first and second coatings formed in this way preferably is between 50 nm and 1000 nm inclusive. If less than 50 nm sufficient joining strength cannot be obtained, while if in excess of 1000 nm they tend to peel away owing to the disparity in thermal expansion coefficient with the bulk substrate or the second substrate.

For the above-described bonding of the bulk substrate 4 together with the second substrate 2, preferably the second substrate 2 is bonded onto the bulk substrate 4 along its N-face side. This makes it possible, when the bulk substrate 4 is severed in a later procedural step, to have the face of the first substrate on the side where epitaxial layers are crystal-grown be the Ga face, and accordingly facilitates the crystal growth of epitaxial layers onto the first substrate.

Step of Heating Up to First Temperature and
Step of Sustaining First Temperature for Fixed Time The temperature of the obtained bonded substrate 20 is elevated to a first temperature, and the first temperature is sustained for a fixed time. This first temperature is determined based on the thermal expansion coefficient of the first substrate 1 and the thermal expansion coefficient of the second substrate 2. Namely, letting the first temperature be $T_1$ ° C., the thermal expansion coefficient of the first substrate be $A \times 10^{-6}$/° C., and the thermal expansion coefficient of the second substrate be $B \times 10^{-6}$/° C., the temperature is determined so as to satisfy the following formula (I).

$$215 \leq 10(A-B)^2 - 10(A-B) + T_1 \leq 410 \quad (I)$$

Adjusting the first temperature so as to satisfy Formula (I) makes it possible to heighten markedly the joining strength between the bulk substrate 4 (first substrate) and the second substrate 2, without exfoliation along the fragile region 3 getting underway. Therefore, when the bulk substrate 4 is severed in the later procedural step, the forceful stress that acts on the interface between the bulk substrate 4 and the second substrate 2 can be withstood.

If the first temperature is set such as to be lower than the above-noted lower-limit value of $10(A-B)^2 - 10(A-B) + T_1$ in Formula (I), the joining strength cannot be sufficiently heightened, and conversely, if the first temperature is set such as to be higher than the above-noted upper-limit value, the result, undesirably, is that exfoliation along the fragile region 3 proceeds before the joining strength between the bulk substrate 4 (first substrate) and the second substrate 2 is heightened.

The lower-limit value of $10(A-B)^2 - 10(A-B) + T_1$ in above-noted Formula (I) preferably is 325, with 355 being more preferable. Meanwhile, the upper-limit value preferably is 395, with 385 being more preferable. When having the first temperature be between 100° C. and 500° C. inclusive, the thermal expansion coefficients of the first substrate 1 and the second substrate 2 preferably are determined such that Formula (I) is satisfied.

While the atmosphere when the first temperature is sustained will differ depending on the materials of the first substrate 1 and the second substrate 2, it is preferable that it be an atmosphere containing one or more gases selected from the group consisting of nitrogen, oxygen, hydrogen, argon and ammonia.

Also, from experiments it has been understood that the time period $t_1$ for which the first temperature is sustained preferably is determined according to the first temperature $T_1$. Namely, existing between the first temperature $T_1$ and its sustain time $t_1$ is a relationship in which the reciprocal $1/t_1$ of the sustain time is proportional to $\exp(-E/kT_1)$. Herein, E is a value giving the activation energy intrinsic to the materials, and k is Boltzmann's constant. The sustain time $t_1$ that is derived from the proportional relationship just described is of shorter duration the hotter the first temperature is, and is of longer duration the cooler the first temperature is. The first-temperature sustain time $t_1$ preferably is between 10 minutes and 300 minutes inclusive.

Bulk-Substrate Severing Step

Figure 4:
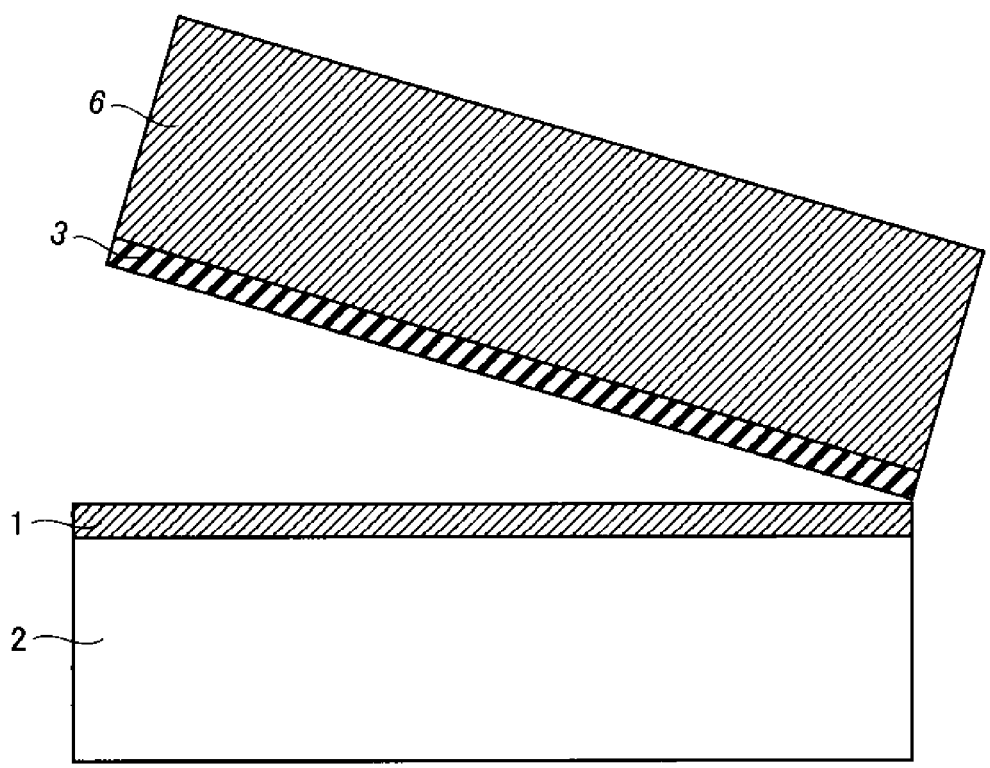
FIG. 4 is a cross-sectional, schematic diagram comprehending a composite substrate having been severed with the fragile region as a boundary.

In such a way that the first substrate 1, being a part of the bulk substrate having been bonded-on as described above, is left on the second substrate 2, the remaining portion 6 of the bulk substrate is severed from the bonded substrate 20, thereby making it possible to fabricate a composite substrate in which the first substrate 1 has been bonded onto the second substrate 2 (FIG. 4).

Severing of the bulk substrate along the fragile region 3 is carried out by applying an amount of energy to the fragile region 3. While the severing method is not particularly limited, it may be any of techniques including applying stress, applying heat, subjecting to ultrasonic waves, irradiating with a light beam, or cutting by means of a mechanical tool.

Concrete examples that can be given include techniques of polishing, etc. the bulk substrate, techniques of slicing the bulk substrate, and techniques of elevating the temperature of the bulk substrate itself. As means for slicing the bulk substrate it is preferable to utilize, for example, electrical discharge machining, wire saws, outer-diameter saws, inner-diameter saws, laser irradiation, etc.

Meanwhile, in instances in which a technique of elevating the temperature of the bulk substrate itself is utilized, preferably the temperature of the bonded substrate 20 is elevated to a second temperature, and this second temperature is sustained for a fixed time. Elevating the bulk-substrate temperature to the second temperature expands the ions implanted therein, enabling the bulk substrate to split apart with the fragile region 3 as a boundary.

The second temperature will differ depending on the dose of ions in the fragile region 3; the second temperature tends to be lower the greater is the dose (that is, the larger the ion implantation amount). Also, it is necessary that the second temperature be hotter than the first temperature that is for heightening the joining strength, and consequently the second temperature is set higher than the first temperature, with the dose being decided, within the earlier-described range, with respect to the second temperature. The second temperature in this case preferably is between 150° C. and 550° C. inclusive.

Further, as to the second-temperature sustain time, likewise as for the above-described situation with the first temperature, a relationship exists between the second temperature $T_2$ and its sustain time $t_2$, in which the reciprocal $1/t_2$ of the sustain time is proportional to $\exp(-E/kT_2)$. This sustain time preferably is about 10 minutes. The atmosphere under which the second temperature is sustained preferably is the same as the atmosphere when the first temperature is sustained.

Step of Heating Up to Third Temperature and
Step of Sustaining Third Temperature for Fixed Time In respect of the composite substrate fabricated in the manner described above, preferably the temperature of the composite substrate is elevated to a third temperature, and this third temperature is sustained for a fixed time. Sustaining the third temperature makes it possible to heighten the joining strength between the first substrate and the second substrate, thereby making it possible to improve yields when devices are fabricated.

What is more, by holding the composite substrate at the third temperature, the ions implanted when the fragile region was formed can be degassed from the first substrate, making it possible to restore the crystallinity of the first substrate's nitride compound semiconductor (that is, outstanding crystallinity can be obtained). It should be noted that this degassing of the ions may be carried out by mechanically or chemically removing the damaged region.

Owing to the fact that the thickness of the first substrate 1 is pronouncedly thin with respect to the second substrate 2, exfoliation originating in thermal expansion coefficient disparity between the substrates is unlikely to occur even if the aforedescribed third temperature is made hotter than the first temperature and the second temperature. Given these factors, it is preferable that the third temperature be between 600° C. and 1000° C. inclusive. Further, in cases where, as described above, a metal film, a first coating, and a second coating are formed on the bonding faces, by elevating the temperature up to the third temperature, these constituent materials turn into a solid solution, enabling further heightening of the joining strength.

Further, as to the third-temperature sustain time, likewise as for the above-described situation with the first temperature, a relationship exists between the third temperature $T_3$ and its sustain time $t_3$, in which the reciprocal $1/t_3$ of the sustain time is proportional to $\exp(-E/kT_3)$, with this sustain time preferably being between 15 seconds and 60 minutes inclusive. Here, for the atmosphere under which the third temperature is sustained, preferably the same atmosphere is utilized as when the first temperature is sustained.

Embodying Mode 2

A composite-substrate manufacturing method of the present Embodying Mode 2 is characterized in including: a step (FIG. 2) of carrying out implantation of ions at an angle θ being 0°<θ≤7° with respect to a normal to a surface of a bulk substrate composed of the nitride compound semiconductor; a step (FIG. 3) of making it so that said surface of the bulk substrate opposes a second substrate, and bonding the bulk substrate and the second substrate together; and a step (FIG. 4) of producing a composite substrate by severing, in such as way as to leave a first substrate as a portion of the bulk substrate atop the second substrate, the remaining portion of the bulk substrate from the bonded substrate.

With Embodying Mode 2, carrying out, in the step of implanting ions into the bulk substrate, the ion implantation at an angle θ of 0°<θ≤7° with respect to a normal to the bulk substrate is let be a special feature. An efficacy of heightening the joining strength, tantamount to that of Embodying Mode 1, can thereby be gained. In the following, the explanation of a manufacturing method of the present Embodying Mode 2 will not repeat description of portions that are redundant over Embodying Mode 1.

Step of Implanting Ions from a Designated Angle θ

In the present Embodying Mode 2, ion implantation is carried out at an angle 8 of 0°<θ≤7° with respect to a normal to the surface of the bulk substrate 4. In this way irradiating the bulk substrate 4 with ions not perpendicular to a normal to the surface but, moreover, possessing a tilt of 7° or less makes heightening the joining strength between the bulk substrate 4 (first substrate) and the second substrate possible. In instances in which ions are in this way implanted via a designated angle with respect to the bulk substrate, the temperature does not necessarily have to be elevated to and sustained at the first temperature, in the manner of Embodying Mode 1. It should be understood that of course the temperature may be elevated to the first temperature.

While the detailed mechanism whereby the joining strength between the first substrate and the second substrate is heightened when as described above ions are irradiated at an angle is not clear, it is likely that irradiating ions along a diagonal disposes the implanted ions not only along the c-axis but also along the a-axis of the crystal constituting the bulk substrate, and when compressive and tensive stress is applied along the a-axis of the crystal constituting the bulk substrate, the ions disposed along the aforementioned a-axis will migrate in such a way as to compensate the stress. It is speculated that the cushioning ability of the first substrate is thereby improved, heightening the joining strength between the bulk substrate (first substrate) and the second substrate.

On the other hand, it is believed that because ions will tend to situate along the c-axis of the crystal constituting the bulk substrate when ions are implanted along a perpendicular to its surface, the just-noted cushioning ability will not be obtained, such that neither will the efficacy of improvement in the joining strength be obtained.

In this regard, the arrangement (along the a-axis or along the c-axis) of ions in the crystal of the bulk substrate is presumed to be based on the axial ratio of the crystal constituting the bulk substrate after it has been implanted with ions. For the axial ratio, measurements of the crystal's c-axis length and a-axis length are obtained by subjecting the post-ion-implantation bulk substrate to x-ray diffraction, and calculating the ratio based on the measurements. Therein, it is believed that larger c/a axial ratios indicate ions being disposed along the c-axis, while smaller c/a axial ratios indicate ions being disposed along the a-axis. Accordingly, with smaller values of the c/a axial ratio, the cushioning ability of the bulk substrate is heightened, such that the joining strength rises.

As described above, with the present Embodying Mode 2, except for the carrying out of ion implantation at an angle θ of 0°<θ≤7° with respect to a normal to the surface of the bulk substrate, a composite substrate of the present embodying mode can be fabricated by the same method as that of Embodying Mode 1.

Embodiments

While embodiment examples will be given in the following to explain the present invention in further detail, the present invention is not limited by these examples.

Embodiment Example 1

To begin with, as the nitride-compound-semiconductor bulk substrate, a GaN wafer of 50.8 mm diameter that had been doped with oxygen was utilized, and either side of the GaN wafer was polished to prepare a (500 μm thickness) bulk substrate both sides of which had been rendered a specular face. The nitride compound semiconductor (GaN) constituting this bulk substrate had a hexagonal crystalline structure, with the (0001) face being the wafer face, and its resistivity was not greater than 1 ohm·cm and its carrier concentration was not less than $1 \times 10^{17}$ cm$^{-3}$.

Next, a fragile region (FIG. 2) was created in the bulk substrate in a region whose depth from the N-face was approximately 300 to 500 nm, by irradiating (implanting) the N-face of the bulk substrate with hydrogen ions along a normal to that face. As for the irradiation parameters, it was carried out by having the acceleration voltage be 60 keV, and with the dose being $5 \times 10^{17}$/cm$^2$.

Thereafter the irradiation face was washed, and in turn the bulk substrate was placed into a CVD apparatus. A first coating, composed of $SiO_2$, was then grown to a thickness of 250 nm onto the N-face of the bulk substrate. Next, the bulk substrate was placed into a dry-etching device, and electrical discharge was carried out on the first coating on the bulk substrate within argon gas, whereby the surface was cleaned in a plasma.

Meanwhile, onto a surface of a second substrate, of 50.8 mm diameter, 300 μm thickness and composed of spinel, a second coating, composed of $SiO_2$, of 250 nm thickness was formed. The second coating on the second substrate was electrically discharged within argon gas to treat the surface with a plasma.

Then, within atmospheric air the aforedescribed first-coating covered face of the bulk substrate and the second-coating covered face of the second substrate were set against each other and bonded together, and the article was placed into a dry etching chamber, into which argon gas was introduced. The RF power was put at 100 W, the introduction-flow volume of the argon gas was put at 50 sccm, and the chamber-internal pressure was put at 6.7 Pa.

Figure 3:
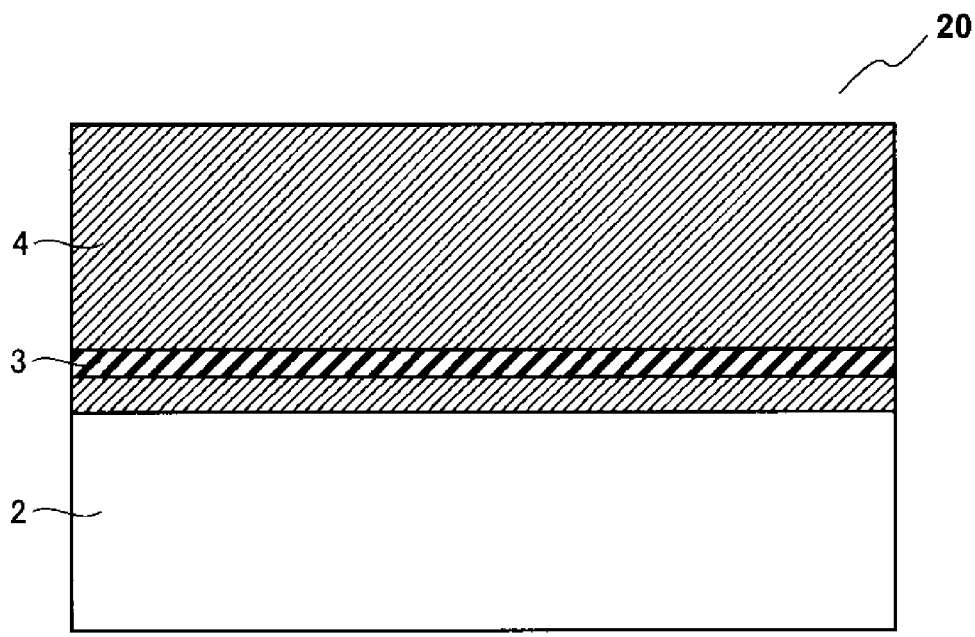
FIG. 3 is a cross-sectional, schematic diagram representing a bonded substrate after a second substrate has been bonded onto the bulk substrate.

While the bulk substrate 4 and the second substrate were bonded together by means of the foregoing operations, on account of the joining strength at their interface being insufficient, subsequently the article was ramped up to 300° C., being the first temperature, within nitrogen and was held there for 120 minutes, whereby the adhesive strength between the two substrates was heightened (FIG. 3).

Next, the article was ramped up to 400° C., being the second temperature, and was held there for 10 minutes. This caused the hydrogen ions, implanted as described above, to expand, severing (FIG. 4) the bulk substrate in such a way that a first substrate was left atop the second substrate and yielding a composite substrate of the present embodiment example. The thickness of the first substrate in the composite substrate obtained in this way was approximately 400 nm.

Embodiment Examples 2 through 47 and Comparative Examples 1 through 3 were prepared as below, following Table I and Table II. It should be noted that the thermal expansion coefficients for the materials set forth in Table I were, respectively, $5.4 \times 10^{-6}$/° C. for GaN, $7.5 \times 10^{-6}$/° C. for spinel, $7 \times 10^{-6}$/° C. for sapphire, $2.6 \times 10^{-6}$/° C. for silicon, and $4.2 \times 10^{-6}$/° C. for AlN.

Embodiment Examples 2-9

With the exception of the first temperatures and the time periods for which they were sustained differing, as in Table II below, from those for the composite substrate of Embodiment Example 1, the examples were fabricated by the same method as that of Embodiment Example 1. It should be noted that "-" in the column s of Table II indicates that ramp-up to that temperature was not carried out.

Embodiment Examples 10 & 11

With the exception of the doses of ions implanted into the bulk substrate differing, as in Table II, from that for the composite substrate of Embodiment Example 1, the examples were fabricated by the same method as that of Embodiment Example 1.

Embodiment Examples 12-14

With the exceptions of the sizes of the bulk substrate differing, as in Table I, and the first temperatures differing, as in Table II, from those of the composite substrate of Embodiment Example 1, the examples were fabricated by the same method as that of Embodiment Example 1.

Embodiment Examples 15-26

With the exceptions of the compositions of the second substrate differing, as in Table I, and the first temperatures differing, as in Table II, from those for the composite substrate of Embodiment Example 12, the examples were fabricated by the same method as that of Embodiment Example 12. For example, Embodiment Example 16 indicates that a second substrate composed of GaN was utilized, and that the bulk substrate and the second substrate were bonded together with the 360° C. being the first temperature. It should be noted that while polycrystals composed of GaN were utilized as the second substrate in Embodiment Examples 15 through 17, a material whose crystallinity is inferior to that of the GaN constituting the first substrate may be utilized. Also, in Embodiment Examples 21 through 23, the second coating on the second substrate may be formed by heat oxidization.

Embodiment Examples 27 & 28

With the exception of the inclusion of a step of, after the composite substrates had been fabricated, further ramping them up to and sustaining them at third temperatures being different with respect to the composite substrate of Embodiment Example 1, the examples were fabricated by the same method as that of Embodiment Example 1. For example, Embodiment Example 27 in Table II indicates that after the composite substrate was fabricated, the temperature thereof was held at 800° C. for 5 minutes.

Embodiment Examples 29-35

With the exception of the inclusion of a step of, after the composite substrates had been fabricated, further ramping them up to third temperatures being different, as in Table II, with respect to the composite substrate of Embodiment Example 1, the examples were fabricated by the same method as that of Embodiment Example 1.

Embodiment Example 36

With the exceptions, in respect of the composite substrate of Embodiment Example 1, that a second substrate composed of silicon was utilized, that on the surface of the bulk substrate, instead of forming the first coating, a metal film of 250 nm thickness, composed of tungsten, was formed, and that a second coating was not formed on the surface of the second substrate, the examples were fabricated by the same method as that of Embodiment Example 1. It should be noted that "-" in the columns of Table I indicates that a second coating was not formed.

Embodiment Example 37

With the exception of the inclusion of a step of, after the composite substrate had been fabricated, further ramping it up to a third temperature being different, as in Table II, with respect to the composite substrate of Embodiment Example 36, the example was fabricated by the same method as that of Embodiment Example 1.

Embodiment Examples 38-43

With the exceptions of the angles during ion implantation and of not including a step of ramping up to and sustaining at the first temperature being different with respect to the composite substrate of Embodiment Example 1, the examples were fabricated by the same method as that of Embodiment Example 1. For example, with Embodiment Example 39 in Table II, ion implantation was carried out at an angle forming 0.3° with respect to a normal to the N-face of the bulk substrate, while elevation of its temperature to, and holding it at, the first temperature was not carried out.

Embodiment Examples 44 & 45

With the exceptions of the angles during ion implantation and of the size of the bulk substrates differing, as indicated in Tables I and II, from those for the composite substrate of Embodiment Example 1, the examples were fabricated by the same method as that of Embodiment Example 1.

Embodiment Example 46

With the exception of, with respect to the composite substrate of Embodiment Example 44, including a step of ramping up to and sustaining at a third temperature, the example was fabricated by the same method as that of Embodiment Example 44. The temperature/conditions for ramping up to and sustaining at the third temperature are as indicated in Table II.

Embodiment Example 47

With the exception of, with respect to the composite substrate of Embodiment Example 45, including a step of ramping up to and sustaining at a third temperature, the example was fabricated by the same method as that of Embodiment Example 45. The temperature/conditions for ramping up to and sustaining at the third temperature are as indicated in Table II.

COMPARATIVE EXAMPLE 1

With the exception of not including a step of ramping up to and sustaining at the first temperature being different with respect to the composite substrate of Embodiment Example 1, the example was fabricated by the same method as that of Embodiment Example 1.

COMPARATIVE EXAMPLES 2 & 3

With the exception of the step of ramping up to and sustaining at the first temperature being different, as in Table II, with respect to the composite substrate of Embodiment Example 1, the example was fabricated by the same method as that of Embodiment Example 1.

TABLE I

| | Bulk substrate (First substrate) | | | | Second substrate | | | |
| | | | First coating | | | | Second coating | |
| | Comp. | Size (mm) | Comp. | Thick. (nm) | Comp. | Size (mm) | Comp. | Thick. (nm) |
|---|---|---|---|---|---|---|---|---|
| Emb. Ex. 1 | GaN | 50.8 | $SiO_2$ | 250 | Spinel | 50.8 | $SiO_2$ | 250 |
| Emb. Ex. 2 | GaN | 50.8 | $SiO_2$ | 250 | Spinel | 50.8 | $SiO_2$ | 250 |
| Emb. Ex. 3 | GaN | 50.8 | $SiO_2$ | 250 | Spinel | 50.8 | $SiO_2$ | 250 |
| Emb. Ex. 4 | GaN | 50.8 | $SiO_2$ | 250 | Spinel | 50.8 | $SiO_2$ | 250 |
| Emb. Ex. 5 | GaN | 50.8 | $SiO_2$ | 250 | Spinel | 50.8 | $SiO_2$ | 250 |
| Emb. Ex. 6 | GaN | 50.8 | $SiO_2$ | 250 | Spinel | 50.8 | $SiO_2$ | 250 |
| Emb. Ex. 7 | GaN | 50.8 | $SiO_2$ | 250 | Spinel | 50.8 | $SiO_2$ | 250 |
| Emb. Ex. 8 | GaN | 50.8 | $SiO_2$ | 250 | Spinel | 50.8 | $SiO_2$ | 250 |
| Emb. Ex. 9 | GaN | 50.8 | $SiO_2$ | 250 | Spinel | 50.8 | $SiO_2$ | 250 |
| Emb. Ex. 10 | GaN | 50.8 | $SiO_2$ | 250 | Spinel | 50.8 | $SiO_2$ | 250 |
| Emb. Ex. 11 | GaN | 50.8 | $SiO_2$ | 250 | Spinel | 50.8 | $SiO_2$ | 250 |
| Emb. Ex. 12 | GaN | 101.6 | $SiO_2$ | 250 | Spinel | 101.6 | $SiO_2$ | 250 |
| Emb. Ex. 13 | GaN | 101.6 | $SiO_2$ | 250 | Spinel | 101.6 | $SiO_2$ | 250 |
| Emb. Ex. 14 | GaN | 101.6 | $SiO_2$ | 250 | Spinel | 101.6 | $SiO_2$ | 250 |
| Emb. Ex. 15 | GaN | 101.6 | $SiO_2$ | 250 | GaN | 101.6 | $SiO_2$ | 250 |
| Emb. Ex. 16 | GaN | 101.6 | $SiO_2$ | 250 | GaN | 101.6 | $SiO_2$ | 250 |
| Emb. Ex. 17 | GaN | 101.6 | $SiO_2$ | 250 | GaN | 101.6 | $SiO_2$ | 250 |
| Emb. Ex. 18 | GaN | 101.6 | $SiO_2$ | 250 | Sapphire | 101.6 | $SiO_2$ | 250 |
| Emb. Ex. 19 | GaN | 101.6 | $SiO_2$ | 250 | Sapphire | 101.6 | $SiO_2$ | 250 |
| Emb. Ex. 20 | GaN | 101.6 | $SiO_2$ | 250 | Sapphire | 101.6 | $SiO_2$ | 250 |
| Emb. Ex. 21 | GaN | 101.6 | $SiO_2$ | 250 | Si | 101.6 | $SiO_2$ | 250 |
| Emb. Ex. 22 | GaN | 101.6 | $SiO_2$ | 250 | Si | 101.6 | $SiO_2$ | 250 |
| Emb. Ex. 23 | GaN | 101.6 | $SiO_2$ | 250 | Si | 101.6 | $SiO_2$ | 250 |
| Emb. Ex. 24 | GaN | 101.6 | $SiO_2$ | 250 | AlN | 101.6 | $SiO_2$ | 250 |
| Emb. Ex. 25 | GaN | 101.6 | $SiO_2$ | 250 | AlN | 101.6 | $SiO_2$ | 250 |
| Emb. Ex. 26 | GaN | 101.6 | $SiO_2$ | 250 | AlN | 101.6 | $SiO_2$ | 250 |
| Emb. Ex. 27 | GaN | 50.8 | $SiO_2$ | 250 | Spinel | 50.8 | $SiO_2$ | 250 |
| Emb. Ex. 28 | GaN | 50.8 | $SiO_2$ | 250 | Spinel | 50.8 | $SiO_2$ | 250 |
| Emb. Ex. 29 | GaN | 50.8 | $SiO_2$ | 250 | Spinel | 50.8 | $SiO_2$ | 250 |
| Emb. Ex. 30 | GaN | 50.8 | $SiO_2$ | 250 | Spinel | 50.8 | $SiO_2$ | 250 |
| Emb. Ex. 31 | GaN | 50.8 | $SiO_2$ | 250 | Spinel | 50.8 | $SiO_2$ | 250 |
| Emb. Ex. 32 | GaN | 50.8 | $SiO_2$ | 250 | Spinel | 50.8 | $SiO_2$ | 250 |
| Emb. Ex. 33 | GaN | 50.8 | $SiO_2$ | 250 | Spinel | 50.8 | $SiO_2$ | 250 |
| Emb. Ex. 34 | GaN | 50.8 | $SiO_2$ | 250 | Spinel | 50.8 | $SiO_2$ | 250 |
| Emb. Ex. 35 | GaN | 50.8 | $SiO_2$ | 250 | Spinel | 50.8 | $SiO_2$ | 250 |
| Emb. Ex. 36 | GaN | 50.8 | W | 250 | Si | 50.8 | — | — |
| Emb. Ex. 37 | GaN | 50.8 | W | 250 | Si | 50.8 | — | — |
| Emb. Ex. 38 | GaN | 50.8 | $SiO_2$ | 250 | Spinel | 50.8 | $SiO_2$ | 250 |
| Emb. Ex. 39 | GaN | 50.8 | $SiO_2$ | 250 | Spinel | 50.8 | $SiO_2$ | 250 |
| Emb. Ex. 40 | GaN | 50.8 | $SiO_2$ | 250 | Spinel | 50.8 | $SiO_2$ | 250 |
| Emb. Ex. 41 | GaN | 50.8 | $SiO_2$ | 250 | Spinel | 50.8 | $SiO_2$ | 250 |
| Emb. Ex. 42 | GaN | 50.8 | $SiO_2$ | 250 | Spinel | 50.8 | $SiO_2$ | 250 |
| Emb. Ex. 43 | GaN | 50.8 | $SiO_2$ | 250 | Spinel | 50.8 | $SiO_2$ | 250 |
| Emb. Ex. 44 | GaN | 101.6 | $SiO_2$ | 250 | Spinel | 101.6 | $SiO_2$ | 250 |
| Emb. Ex. 45 | GaN | 101.6 | $SiO_2$ | 250 | Spinel | 101.6 | $SiO_2$ | 250 |
| Emb. Ex. 46 | GaN | 101.6 | $SiO_2$ | 250 | Spinel | 101.6 | $SiO_2$ | 250 |
| Emb. Ex. 47 | GaN | 101.6 | $SiO_2$ | 250 | Spinel | 101.6 | $SiO_2$ | 250 |

TABLE I-continued

| | Bulk substrate (First substrate) | | | | Second substrate | | | |
| | | | First coating | | | | Second coating | |
| | Comp. | Size (mm) | Comp. | Thick. (nm) | Comp. | Size (mm) | Comp. | Thick. (nm) |
|---|---|---|---|---|---|---|---|---|
| Comp. Ex. 1 | GaN | 50.8 | SiO$_2$ | 250 | Spinel | 50.8 | SiO$_2$ | 250 |
| Comp. Ex. 2 | GaN | 50.8 | SiO$_2$ | 250 | Spinel | 50.8 | SiO$_2$ | 250 |
| Comp. Ex. 3 | GaN | 50.8 | SiO$_2$ | 250 | Spinel | 50.8 | SiO$_2$ | 250 |

TABLE II

| | Ion implantation | | | First temp. | | Second temp. | | Third temp. | |
| | Dose (cm$^{-2}$) | Implant angle (θ) | Axial ratio c/a | Temp. (°C.) | Time (min) | Temp. (°C.) | Time (min) | Temp. (°C.) | Time (min) |
|---|---|---|---|---|---|---|---|---|---|
| Emb. Ex. 1 | 5 × 10$^{17}$ | 0 | 1.630 | 300 | 120 | 400 | 10 | — | — |
| Emb. Ex. 2 | 5 × 10$^{17}$ | 0 | 1.630 | 150 | 120 | 400 | 10 | — | — |
| Emb. Ex. 3 | 5 × 10$^{17}$ | 0 | 1.630 | 200 | 120 | 400 | 10 | — | — |
| Emb. Ex. 4 | 5 × 10$^{17}$ | 0 | 1.630 | 320 | 120 | 400 | 10 | — | — |
| Emb. Ex. 5 | 5 × 10$^{17}$ | 0 | 1.630 | 350 | 120 | 400 | 10 | — | — |
| Emb. Ex. 6 | 5 × 10$^{17}$ | 0 | 1.630 | 300 | 40 | 400 | 10 | — | — |
| Emb. Ex. 7 | 5 × 10$^{17}$ | 0 | 1.630 | 300 | 80 | 400 | 10 | — | — |
| Emb. Ex. 8 | 5 × 10$^{17}$ | 0 | 1.630 | 300 | 180 | 400 | 10 | — | — |
| Emb. Ex. 9 | 5 × 10$^{17}$ | 0 | 1.630 | 300 | 240 | 400 | 10 | — | — |
| Emb. Ex. 10 | 3 × 10$^{17}$ | 0 | 1.630 | 300 | 120 | 500 | 10 | — | — |
| Emb. Ex. 11 | 7 × 10$^{17}$ | 0 | 1.630 | 150 | 120 | 200 | 10 | — | — |
| Emb. Ex. 12 | 5 × 10$^{17}$ | 0 | 1.630 | 300 | 120 | 400 | 10 | — | — |
| Emb. Ex. 13 | 5 × 10$^{17}$ | 0 | 1.630 | 280 | 120 | 400 | 10 | — | — |
| Emb. Ex. 14 | 5 × 10$^{17}$ | 0 | 1.630 | 340 | 120 | 400 | 10 | — | — |
| Emb. Ex. 15 | 5 × 10$^{17}$ | 0 | 1.630 | 300 | 120 | 400 | 10 | — | — |
| Emb. Ex. 16 | 5 × 10$^{17}$ | 0 | 1.630 | 360 | 120 | 400 | 10 | — | — |
| Emb. Ex. 17 | 5 × 10$^{17}$ | 0 | 1.630 | 380 | 120 | 400 | 10 | — | — |
| Emb. Ex. 18 | 5 × 10$^{17}$ | 0 | 1.630 | 300 | 120 | 400 | 10 | — | — |
| Emb. Ex. 19 | 5 × 10$^{17}$ | 0 | 1.630 | 340 | 120 | 400 | 10 | — | — |
| Emb. Ex. 20 | 5 × 10$^{17}$ | 0 | 1.630 | 370 | 120 | 400 | 10 | — | — |
| Emb. Ex. 21 | 5 × 10$^{17}$ | 0 | 1.630 | 300 | 120 | 400 | 10 | — | — |
| Emb. Ex. 22 | 5 × 10$^{17}$ | 0 | 1.630 | 330 | 120 | 400 | 10 | — | — |
| Emb. Ex. 23 | 5 × 10$^{17}$ | 0 | 1.630 | 350 | 120 | 400 | 10 | — | — |
| Emb. Ex. 24 | 5 × 10$^{17}$ | 0 | 1.630 | 300 | 120 | 400 | 10 | — | — |
| Emb. Ex. 25 | 5 × 10$^{17}$ | 0 | 1.630 | 360 | 120 | 400 | 10 | — | — |
| Emb. Ex. 26 | 5 × 10$^{17}$ | 0 | 1.630 | 380 | 120 | 400 | 10 | — | — |
| Emb. Ex. 27 | 5 × 10$^{17}$ | 0 | 1.630 | 300 | 120 | 400 | 10 | 800 | 5 |
| Emb. Ex. 28 | 5 × 10$^{17}$ | 0 | 1.630 | 300 | 120 | 400 | 10 | 600 | 5 |
| Emb. Ex. 29 | 5 × 10$^{17}$ | 0 | 1.630 | 300 | 120 | 400 | 10 | 700 | 5 |
| Emb. Ex. 30 | 5 × 10$^{17}$ | 0 | 1.630 | 300 | 120 | 400 | 10 | 900 | 5 |
| Emb. Ex. 31 | 5 × 10$^{17}$ | 0 | 1.630 | 300 | 120 | 400 | 10 | 1000 | 5 |
| Emb. Ex. 32 | 5 × 10$^{17}$ | 0 | 1.630 | 300 | 120 | 400 | 10 | 800 | 0.25 |
| Emb. Ex. 33 | 5 × 10$^{17}$ | 0 | 1.630 | 300 | 120 | 400 | 10 | 800 | 1 |
| Emb. Ex. 34 | 5 × 10$^{17}$ | 0 | 1.630 | 300 | 120 | 400 | 10 | 800 | 30 |
| Emb. Ex. 35 | 5 × 10$^{17}$ | 0 | 1.630 | 300 | 120 | 400 | 10 | 800 | 60 |
| Emb. Ex. 36 | 5 × 10$^{17}$ | 0 | 1.630 | 300 | 120 | 400 | 10 | — | — |
| Emb. Ex. 37 | 5 × 10$^{17}$ | 0 | 1.630 | 300 | 120 | 400 | 10 | 800 | 5 |
| Emb. Ex. 38 | 5 × 10$^{17}$ | 0.1 | 1.629 | — | — | 400 | 10 | — | — |
| Emb. Ex. 39 | 5 × 10$^{17}$ | 0.3 | 1.629 | — | — | 400 | 10 | — | — |
| Emb. Ex. 40 | 5 × 10$^{17}$ | 0.5 | 1.628 | — | — | 400 | 10 | — | — |
| Emb. Ex. 41 | 5 × 10$^{17}$ | 1 | 1.628 | — | — | 400 | 10 | — | — |
| Emb. Ex. 42 | 5 × 10$^{17}$ | 2 | 1.627 | — | — | 400 | 10 | — | — |
| Emb. Ex. 43 | 5 × 10$^{17}$ | 5 | 1.626 | — | — | 400 | 10 | — | — |
| Emb. Ex. 44 | 5 × 10$^{17}$ | 0.1 | 1.630 | 300 | 120 | 400 | 10 | — | — |
| Emb. Ex. 45 | 5 × 10$^{17}$ | 0.3 | 1.630 | 300 | 120 | 400 | 10 | — | — |
| Emb. Ex. 46 | 5 × 10$^{17}$ | 0.1 | 1.630 | 300 | 120 | 400 | 10 | 800 | 5 |
| Emb. Ex. 47 | 5 × 10$^{17}$ | 0.3 | 1.630 | 300 | 120 | 400 | 10 | 800 | 5 |
| Comp. Ex. 1 | 5 × 10$^{17}$ | 0 | 1.630 | — | — | 400 | 10 | — | — |
| Comp. Ex. 2 | 5 × 10$^{17}$ | 0 | 1.630 | 100 | 120 | 400 | 10 | — | — |
| Comp. Ex. 3 | 5 × 10$^{17}$ | 0 | 1.630 | 400 | 120 | 400 | 10 | — | — |

Device Fabrication

Next, epitaxial layers composed of III-nitride semiconductor were formed by MOCVD onto the respective first substrates of the composite substrates of each of the embodiment examples and comparative examples. The epitaxial layers are: an n-type GaN layer of 2 μm thickness; an n-type Al$_{0.05}$Ga$_{0.95}$N layer of 0.5 μm thickness; a light-emitting layer of 100 nm thickness, having a multiquantum-well structure constituted by six pairs of In$_{0.2}$Ga$_{0.8}$N layers and Al$_{0.01}$Ga$_{0.99}$N layers; a p-type Al$_{0.2}$Ga$_{0.8}$N layer of 20 nm thickness; and a p-type GaN layer of 0.15 μm thickness.

Then, so as to leave a portion of the n-type GaN layer, the other epitaxial layers were removed by dry-etching, after which a p-side electrode was formed onto the p-type GaN layer by vacuum vapor deposition or by electron-beam vapor deposition. Next, an n-side electrode was formed onto the n-type GaN layer (the portion from which the other epitaxial layers had been removed), whereby an LED, being a semiconductor device, was obtained.

Joining-Strength Evaluation

In the composite substrates of each of the embodiment examples and each of the comparative examples, the surface area of the portion where, before and after devices were fabricated, the first substrate and the second substrate are joined was measured by taking photographs of the respective composite substrates and devices, and employing an image processing device. With respect to the surface area of the first-substrate surface, the surface area where the second substrate is joined (hereinafter denoted "join surface-area proportion") was thereby calculated. The join surface-area proportion (%) prior to device fabrication is indicated in the "Pre-formation" column in Table III, while the join surface-area proportion (%) following device fabrication is indicated in the "Post-formation" column in Table III.

TABLE III

| | Join surface-area proportion (%) | |
| --- | --- | --- |
| | Pre-formation | Post-formation |
| Emb. Ex. 1 | 100 | 92 |
| Emb. Ex. 2 | 90 | 82 |
| Emb. Ex. 3 | 95 | 87 |
| Emb. Ex. 4 | 98 | 90 |
| Emb. Ex. 5 | 93 | 89 |
| Emb. Ex. 6 | 93 | 81 |
| Emb. Ex. 7 | 95 | 88 |
| Emb. Ex. 8 | 100 | 100 |
| Emb. Ex. 9 | 100 | 100 |
| Emb. Ex. 10 | 100 | 95 |
| Emb. Ex. 11 | 100 | 95 |
| Emb. Ex. 12 | 100 | 90 |
| Emb. Ex. 13 | 91 | 80 |
| Emb. Ex. 14 | 90 | 90 |
| Emb. Ex. 15 | 100 | 100 |
| Emb. Ex. 16 | 100 | 100 |
| Emb. Ex. 17 | 100 | 100 |
| Emb. Ex. 18 | 100 | 93 |
| Emb. Ex. 19 | 100 | 100 |
| Emb. Ex. 20 | 95 | 95 |
| Emb. Ex. 21 | 98 | 93 |
| Emb. Ex. 22 | 100 | 100 |
| Emb. Ex. 23 | 98 | 98 |
| Emb. Ex. 24 | 95 | 93 |
| Emb. Ex. 25 | 100 | 100 |
| Emb. Ex. 26 | 95 | 95 |
| Emb. Ex. 27 | 100 | 100 |
| Emb. Ex. 28 | 100 | 94 |
| Emb. Ex. 29 | 100 | 98 |
| Emb. Ex. 30 | 100 | 100 |
| Emb. Ex. 31 | 100 | 100 |
| Emb. Ex. 32 | 100 | 99 |
| Emb. Ex. 33 | 100 | 100 |
| Emb. Ex. 34 | 100 | 100 |
| Emb. Ex. 35 | 100 | 100 |
| Emb. Ex. 36 | 100 | 95 |
| Emb. Ex. 37 | 100 | 100 |
| Emb. Ex. 38 | 100 | 95 |
| Emb. Ex. 39 | 100 | 100 |
| Emb. Ex. 40 | 100 | 100 |
| Emb. Ex. 41 | 100 | 100 |
| Emb. Ex. 42 | 100 | 100 |
| Emb. Ex. 43 | 100 | 100 |
| Emb. Ex. 44 | 100 | 95 |
| Emb. Ex. 45 | 100 | 100 |
| Emb. Ex. 46 | 100 | 100 |
| Emb. Ex. 47 | 100 | 100 |
| Comp. Ex. 1 | 10 | 10 |
| Comp. Ex. 2 | 75 | 55 |
| Comp. Ex. 3 | 10 | 10 |

Given the resulting join surface-area proportions indicated in Table III, from a comparison of the composite substrates of each embodiment example with the composite substrates of each comparative example it is evident that exfoliation along the interface between the first substrate and the second substrate was unlikely to occur. This is believed to be that with Embodiment Examples 1 through 37, by elevating the temperature to and sustaining it at the first temperature according to the present invention, the joining strength between the first substrate and the second substrate was heightened. Likewise, with Embodiment Examples 38 through 47, it is believed that by irradiating ions along a diagonal with respect to a normal to the bulk substrate, the axial ratio c/a of the first-substrate crystal became smaller (cf. Table II), and thereby the joining strength between the first substrate and the second substrate was heightened.

While a description of embodying modes and embodiment examples of the present invention has been undertaken in the foregoing manner, combining components of each of the embodying modes and embodiment examples to suit is contemplated from the outset.

The presently disclosed embodying modes and embodiment examples should in all respects be considered to be illustrative and not limiting. The scope of the present invention is set forth not by the foregoing description but by the scope of the patent claims, and is intended to include meanings equivalent to the scope of the patent claims and all modifications within the scope.

Reference Signs List

1: first substrate; 2: second substrate; 3: fragile region; 4: bulk substrate; 10: composite substrate; 20: bonded substrate

What is claimed is:

1. A method of manufacturing a composite substrate for epitaxial-layer growth, formed by bonding together a first substrate composed of a nitride compound semiconductor, and a second substrate composed of a material that is either identical with or different from the material constituting the first substrate, the composite-substrate manufacturing method including:
   a step of carrying out implantation of ions through a surface of a bulk substrate composed of the nitride compound semiconductor;
   a step of setting said surface of the bulk substrate against the second substrate and bonding the bulk substrate and the second substrate together to obtain a bonded substrate;
   a step of elevating the temperature of the bonded substrate to a first temperature;
   a step of sustaining the first temperature for a fixed time; and
   a step of producing a composite substrate by severing, in such as way as to leave the first substrate, being a portion of the bulk substrate, atop the second substrate, the remaining portion of the bulk substrate from the bonded substrate;
   characterized in that letting the first temperature be $T_1$° C., the thermal expansion coefficient of the first substrate be $A \times 10^{-6}$/° C., and the thermal expansion coefficient of the second substrate be $B \times 10^{-6}$/° C., the following formula (I) is satisfied $$215 \leq 10(A-B)^2 - 10(A-B) + T_1 \leq 410 \qquad (I).$$

2. The composite-substrate manufacturing method set forth in claim 1, wherein in said step of producing the composite substrate, the remaining portion of the bulk substrate is severed from the bonded substrate by elevating the bonded substrate to a second temperature and sustaining the second temperature for a fixed time.

3. The composite-substrate manufacturing method set forth in claim 1, further including, following said step of producing a composite substrate:
- a step of elevating the composite substrate to a third temperature; and
- a step of sustaining the third temperature for a fixed time.

4. The composite-substrate manufacturing method set forth in claim 3, wherein the third temperature is between 600° C. and 1000° C. inclusive.

5. The composite-substrate manufacturing method set forth in claim 1, including, either before or after said step of carrying out ion implantation through a surface of the bulk substrate, a step of forming a metal film onto said surface of the bulk substrate, wherein the metal film is composed of one between either tungsten or molybdenum, or of both.

6. The composite-substrate manufacturing method set forth in claim 1, including, either before or after said step of carrying out ion implantation:
- a step of forming a first coating on said surface of the bulk substrate; and
- a step of forming a second coating on the second substrate; wherein
- in said step of setting and bonding to obtain a bonded substrate, the first coating and the second coating are set in opposition and bonded together.

* * * * *